(12) United States Patent
Tanaka et al.

(10) Patent No.: US 7,898,815 B2
(45) Date of Patent: Mar. 1, 2011

(54) ELECTRONIC APPARATUS, FLEXIBLE BOARD AND BOARD FIXING MEMBER

(75) Inventors: Kaigo Tanaka, Kawasaki (JP); Katsuichi Goto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 609 days.

(21) Appl. No.: 11/979,739

(22) Filed: Nov. 7, 2007

(65) Prior Publication Data
US 2008/0130251 A1 Jun. 5, 2008

(30) Foreign Application Priority Data
Dec. 5, 2006 (JP) .............................. 2006-328694

(51) Int. Cl.
*H05K 1/18* (2006.01)
(52) U.S. Cl. ................... 361/749; 361/679.28; 174/254
(58) Field of Classification Search ................. 361/749, 361/760, 679.27, 679.28, 679.29; 174/254
See application file for complete search history.

(56) References Cited

U.S. PATENT DOCUMENTS

| 4,756,940 | A | * | 7/1988 | Payne et al. ................... 428/78 |
| 5,100,492 | A | * | 3/1992 | Kober et al. ................. 156/250 |
| 5,398,163 | A | * | 3/1995 | Sano .......................... 361/749 |
| 5,917,158 | A | * | 6/1999 | Takao et al. .................. 174/254 |
| 6,235,995 | B1 | * | 5/2001 | Cheng et al. ................. 174/254 |
| 6,448,508 | B1 | * | 9/2002 | Lequenne .................... 174/261 |
| 6,765,159 | B1 | * | 7/2004 | Uebelein et al. ........... 200/17 R |
| 6,972,946 | B2 | * | 12/2005 | Hamada et al. ......... 361/679.01 |
| 7,267,552 | B2 | * | 9/2007 | Lin et al. ....................... 439/67 |
| 2002/0149914 | A1 | * | 10/2002 | Karasawa et al. ........... 361/749 |

FOREIGN PATENT DOCUMENTS

| JP | 58-225688 | 12/1983 |
| JP | 2519788 | 9/1996 |
| JP | 11-204961 | 7/1999 |

* cited by examiner

*Primary Examiner*—Dameon E Levi
(74) *Attorney, Agent, or Firm*—Fujitsu Patent Center

(57) ABSTRACT

A board fixing member has a first board supporting face and a second board supporting face both of which are adjacent to each other with an angle. A flexible board is fixed in a state in which the flexible board is supported by both the first and second board supporting faces of the board fixing member. The flexible board includes a first reinforcement plate at a first portion supported by the first board supporting face and a second reinforcement plate at a second portion supported by the second board supporting face.

11 Claims, 19 Drawing Sheets

ELECTRONIC APPARATUS, FLEXIBLE BOARD AND BOARD FIXING MEMBER

BACKGROUND OF THE INVENTION

1. Field of the Invention

The present invention relates to an electronic device such as a personal computer, a flexible board that is used in the electronic device and a board fixing member for supporting the flexible board.

2. Description of the Related Art

In recent years, as an electronic device such as a personal computer (hereinafter, abbreviated as a "PC") has been rapidly miniaturized, lighter in weight and sophisticated in function, a flexible board is commonly employed in the electronic device. In addition, a push button switch and a light emitting device are mounted on the flexible board, and the flexible board is supported with a hard supporting plate. The flexible board is covered with a member which allows light to pass through itself or a deformable member such that the flexible board is used to function as a display or a push button.

Various techniques are presented for purposes such as regulating a position of the flexible board in an electronic device.

For example, Japanese Utility Model Application Publication No. H05-33590 shows a structure in which both edges of a wiring board supporting a flexible board are turned over onto the flexible board to be holding claws, which hold both sides of the flexible board.

In addition, Japanese Patent Application Publication No. H11-204961 shows a structure in which a flexible board is supported by inserting a tip of the flexible board into a long opening arranged in a casing which supports the flexible board.

In addition, Japanese Patent Application Publication No. S58-225688 shows a structure in which a flexible board contacts a supporting member which supports the flexible board.

The techniques described in these three documents mentioned above are useful for regulating a position of each flexible board in each condition respectively.

In some cases, a flexible board is required to be supported by two supporting faces which are adjacent with an angle to each other, from a point of view such as designing, visibility or operability. In these cases, when a flexible board is supported by two supporting faces using the techniques in the three documents described above, it is conceivable that, for example, two flexible boards are also prepared to be supported by the respective supporting faces.

However, in this case, the number of components and assembling man-hours are increased, thereby leading to high production costs.

None of the three documents described above show that a flexible board is precisely supported on the two supporting faces described above. In addition, when a flexible board is supported by the two supporting faces, an assembling operability is required to be taken into account.

SUMMARY OF THE INVENTION

In the view of foregoing, according to the present invention, there are provided an electronic apparatus that includes a structure in which a flexible board is readily supported on two supporting faces which are adjacent with an angle to each other, a flexible board suitable to be used in the electronic apparatus and a board fixing member that supports and fixes the flexible board.

An electronic apparatus according to the present invention includes:

a board fixing member that includes a first board supporting face and a second board supporting face both of which are adjacent to each other with an angle; and a flexible board to be fixed in a state in which the flexible board is supported by both the first and second board supporting faces of the board fixing member, wherein the flexible board includes a first reinforcement plate at a first portion supported by the first board supporting face and a second reinforcement plate at a second portion supported by the second board supporting face.

In the electronic apparatus according to the invention, a flexible board, that includes two separate reinforcement plates each for each of two portions supported by two board supporting faces. Accordingly, a mid portion between the two reinforcement plates has flexibility. By the two reinforcement plates, it is possible to precisely and readily support the first and second portions of the flexible board on the first and second board supporting faces.

Here, in the electronic apparatus according to the invention, it is preferable that the board fixing member includes:

an engaging section that engages the first portion of the flexible board; and a fixing section that fixes the second portion of the flexible board by a fastening member, wherein the flexible board includes in the second portion a fastening opening through which the fastening member is to be inserted, and the flexible board is fixed such that the first portion is engaged with the engaging section and the second portion is fastened to the fixing section by the fastening member whose second portion is inserted through the fastening opening. In this case, the fixing section described above may be a tapped hole tapped in the second board supporting face, and the flexible board described above may be engaged with the engaging section and may be fixed by a screw which is inserted through the fastening opening described above and is screwed into the tapped hole.

Since the engaging section and the fixing section are included, after the first portion of the flexible board is engaged with the engaging section, only the second portion is fastened to the fixing section. Accordingly, assembling is improved.

In addition, in the structure including the engaging section and fixing section, it is preferable that the board fixing member includes a positioning boss projected on the second board supporting face, and the flexible board includes in the second portion a positioning opening into which the positioning boss is engaged.

By engaging the positioning boss of the board fixing member into the positioning opening of the flexible board in assembling, positioning becomes further easier and assembling is further improved.

Here, in the electronic apparatus according to the invention, the flexible board may be a board in which at least one push button switch is mounted at one of the first portion and the second portion, and in which at least one light emitting device is mounted at the other portion of the first portion and the second portion.

The electronic apparatus according to the invention is suitable for fixing a flexible board such that a push button switch and a light emitting device on the flexible board are positioned in precise positions on the two supporting faces.

In addition, a flexible board according to the invention is included in an electronic apparatus, and is fixed in a state in which the flexible board is supported by both a first board supporting face and a second board supporting face both of a board supporting member, the face being adjacent to each other with an angle, the flexible board including:

a first reinforcement plate at a first portion supported by the first board supporting face and a second reinforcement plate at a second portion supported by the second board supporting face.

Here, in the flexible board, it is preferable that the board fixing member includes:

an engaging section that engages the first portion of the flexible board; and a fixing section that fixes the second portion of the flexible board by a fastening member, wherein the flexible board includes in the second portion a fastening opening through which a fastening member is inserted, wherein the first portion is engaged with the engaging section, and the second portion is fastened to the fixing section by the fastening member whose second portion is inserted through the fastening opening. In this case, the fixing section described above may be a tapped hole tapped in the second board supporting face, and the flexible board described above may be engaged with the engaging section and may be fixed by a screw which is inserted through the fastening opening described above and is screwed into the tapped hole.

In addition, in the structure including the engaging section and fixing section, it is preferable that the board fixing member includes a positioning boss projected on the second board supporting face, and the flexible board includes in the second portion a positioning opening into which the positioning boss is engaged.

Further, in the electronic apparatus according to the invention, the flexible board may be a board in which at least one push button switch is mounted at one of the first portion and the second portion, and in which at least one light emitting device is mounted at the other portion of the first portion and the second portion.

Furthermore, according to the invention, aboard fixing member that support and fix a flexible board, the board fixing member including:

a first board supporting face; and a second board supporting face formed adjacent to the first board supporting face with an angle, wherein the flexible board is fixed in a state in which the flexible board is supported by both the first and second board supporting faces of the board fixing member, and includes a first reinforcement plate at a first portion supported by the first board supporting face and a second reinforcement plate at a second portion supported by the second board supporting face, and the board fixing member further includes:

an engaging section that is formed in the first board supporting face and engages the first portion of the flexible board; and a fixing section that fixes the second portion by receiving a fastening member which is inserted through a fastening opening formed at the second portion of the flexible board.

By the board fixing member according to the invention, a similar effect can be obtained.

According to the invention, a flexible board can be readily supported on two supporting faces which are adjacent to each other with an angle.

DETAILED DESCRIPTION OF THE INVENTION

In the following, an exemplary embodiment will be described. Here, a notebook PC as one example of the electronic device according to the present invention will be described.

Figure 1:
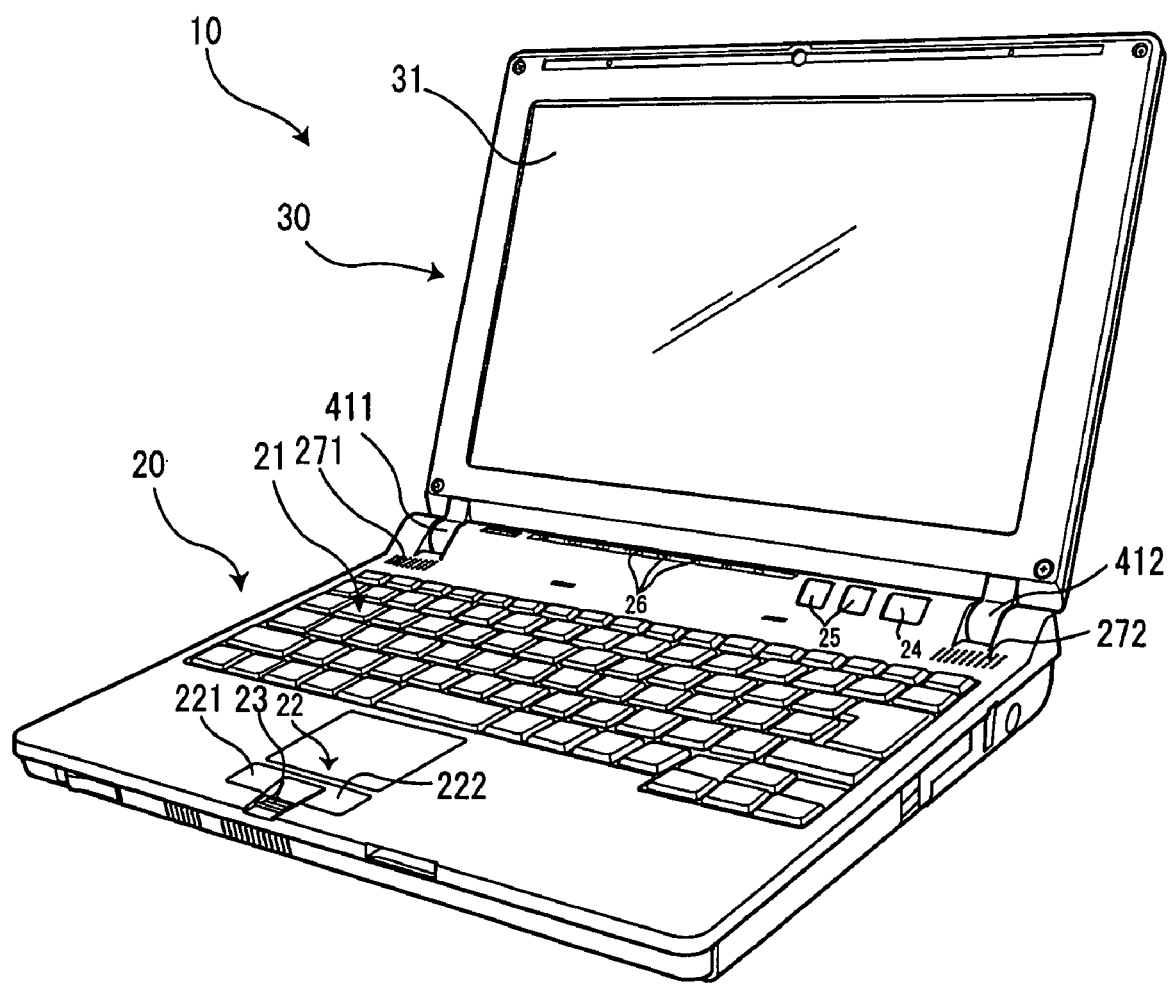
FIG. 1 is a perspective view of a notebook PC in a closed state.
Figure 2:
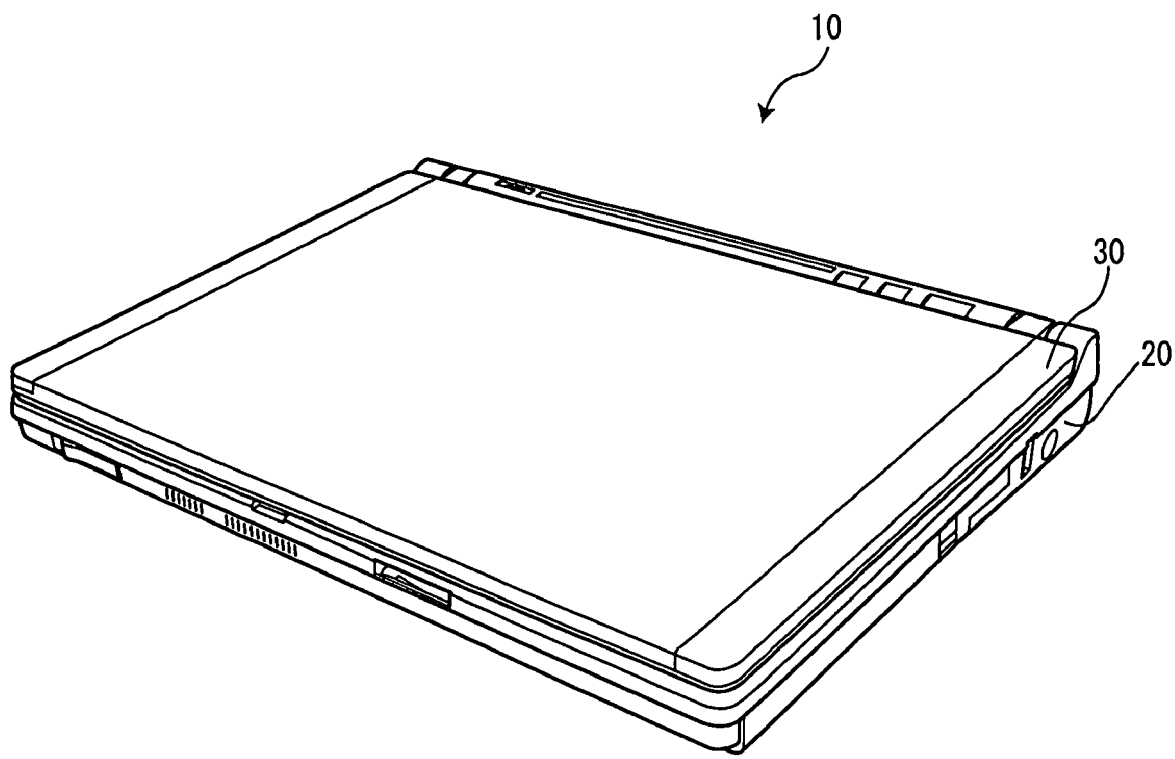
FIG. 2 is a perspective view of the notebook PC in an opened state.

FIG. 1 is a perspective view of a notebook PC in an opened state. FIG. 2 is a perspective view of the notebook PC in an opened state.

This notebook PC 10 includes a main unit 20 and a display unit 30. The display unit 30 is connected through a hinge to the rear of the main unit 20 to open and close freely.

The main unit 20 includes inside its casing various components such as circuit components exemplified by a CPU, a hard disk drive unit including a hard disk, a disk drive unit in which a CD or a DVD is freely loaded to be accessed and unloaded, a PC card slot into which a PC card is inserted to be accessed, and a memory card slot into which various kinds of memory cards are inserted to be accessed.

In addition, on a top face of the main unit 20, are arranged a keyboard 21, a touch pad 22, right and left push buttons 221, 222 for the touch pad, a finger print sensor 23 located in the center between the right and left buttons 221, 222, a main power button 24, multiple function buttons 25, multiple display marks 26, a sound emitting openings 271, 272 for emitting sounds from an inside speaker and etc.

Here, the display marks 26 are arranged on an upward-facing part of the top of the main unit 20. The main power button 24 and function buttons 25 are arranged on a part facing obliquely forward, considering operability.

In addition, a display screen 31 spreaded in a center of the display unit 30 is provided in the display unit 30.

The display unit 30 is hinged to the main unit 20 with a hinge member described later. Decorative components 411 and 412 are fixed to the hinge member such that the hinge member is not exposed at an external appearance of the notebook PC 10.

Figure 3:
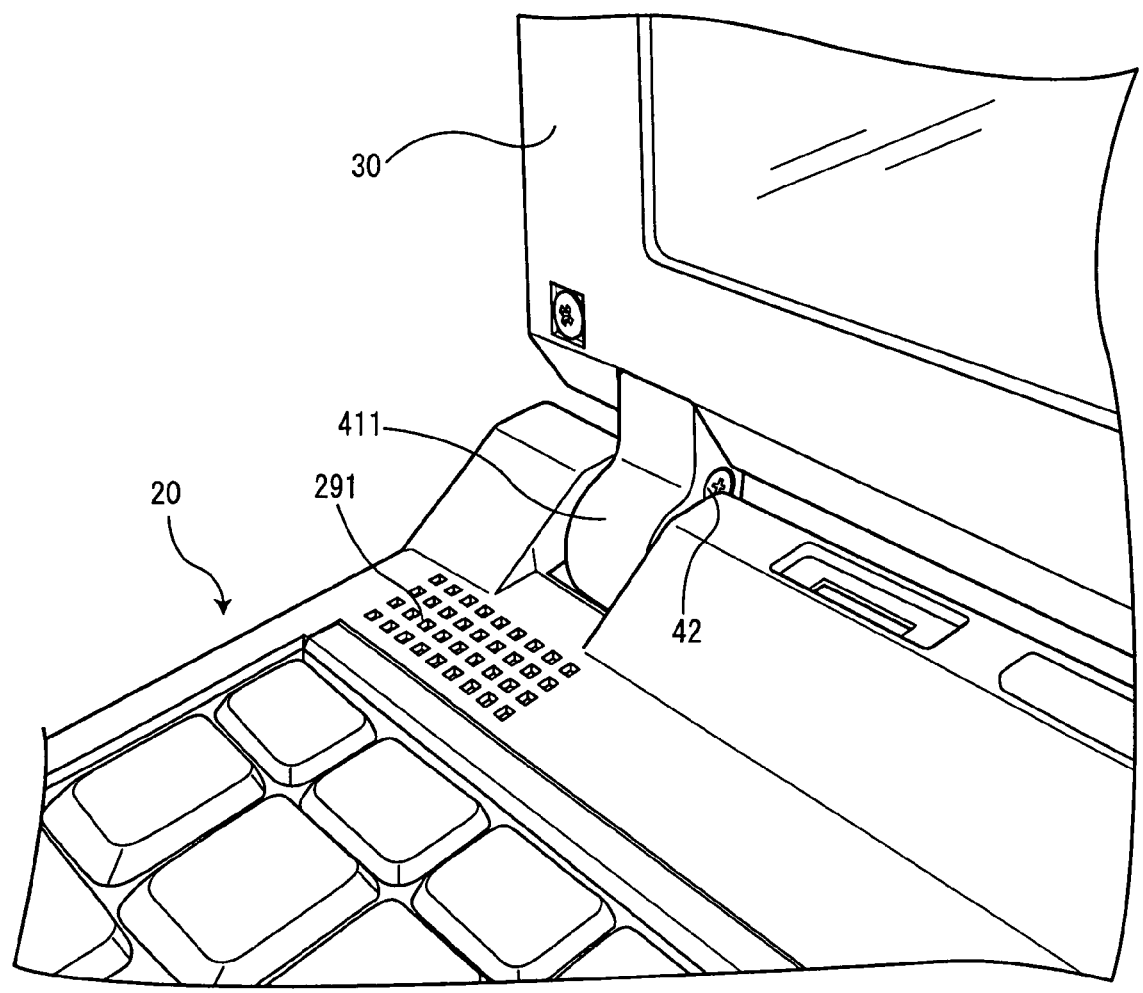
FIG. 3 is an enlarged view showing a portion of one of decorative components of the notebook PC shown in FIGS. 1 and 2.

FIG. 3 is an enlarged view showing a portion around the decorative component 411 of the notebook PC shown in FIGS. 1 and 2.

The decorative component 411 is fixed to the hinge described later with a screw 42 to cover the hinge member such that the hinge member is not exposed at the external appearance.

In addition, as described later, an opening through which a cable is inserted, is arranged in a center of the decorative component 411. A cable extending between the main unit 20 and the display unit 30 is inserted through the opening so that a wiring route for the cable is regulated.

Figure 4:
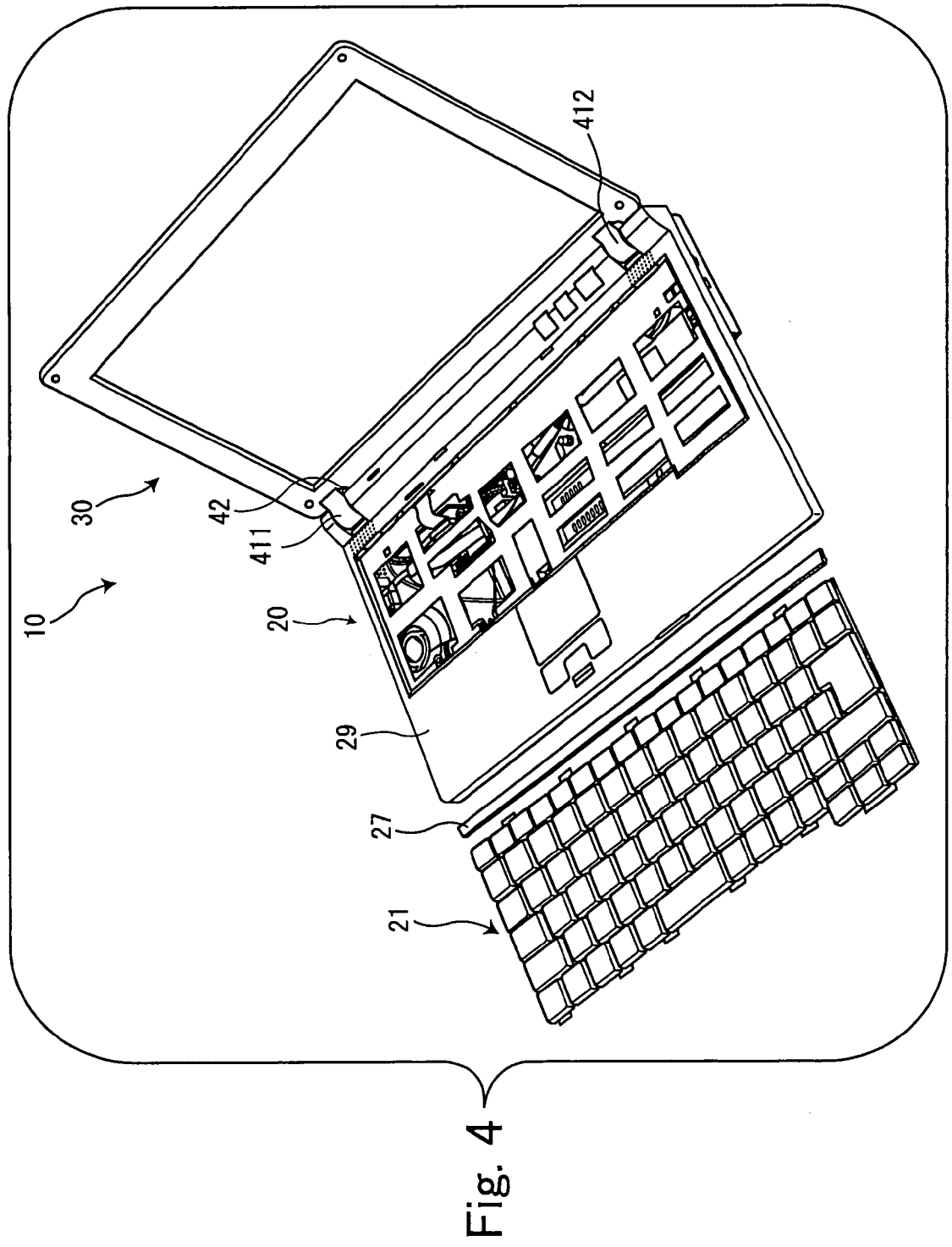
FIG. 4 is an exploded view showing, from above, the notebook PC shown in FIGS. 1 and 2 in a state in which a keyboard and a decorative plate are removed therefrom.

FIG. 4 is an exploded view showing the notebook PC shown in FIGS. 1 and 2 in a state in which a keyboard 21 and a decorative plate 27 are removed from the main unit 20 of the notebook PC.

In the FIG. 4, the keyboard 21 and the decorative plate 27 are removed from the main unit 20, as a result, a top cover 29 of the main unit 20 appears on a top face of the main unit 20, including a portion hindered under the keyboard 21.

Figure 5:
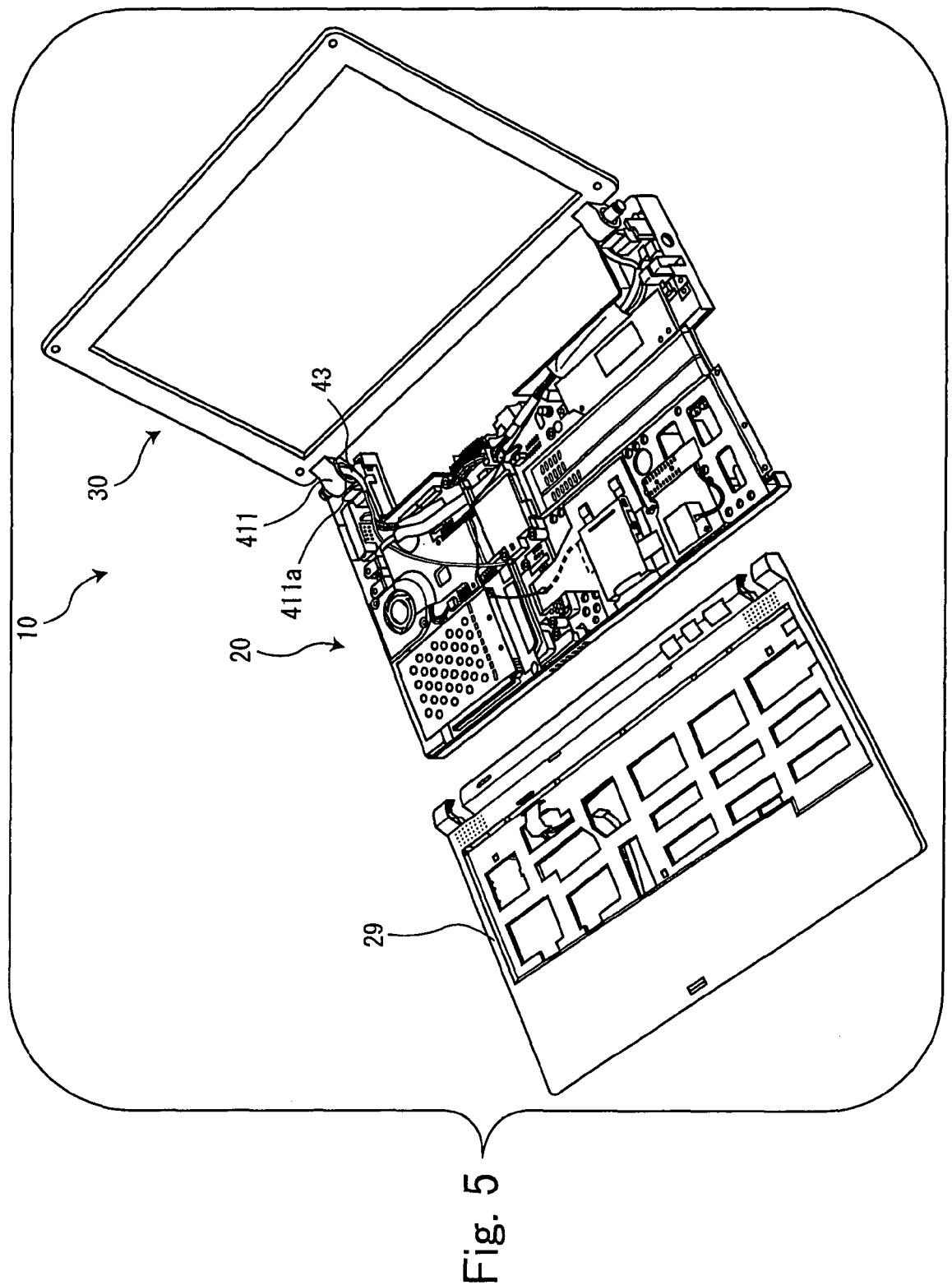
FIG. 5 is an exploded view showing the notebook PC in a state in which a top cover covering a top of a main unit and components fixed on the top cover are further removed from the main unit in a state in which a key board and the like are removed as shown in FIG. 4.

FIG. 5 is an exploded view showing the notebook PC in a state in which the top cover 29 covering a top of the main unit 20 and components fixed on the top cover are further removed from the main unit in a state in which the key board and the like are removed as shown in FIG. 4.

Since the top cover is removed, various kinds of components included in the main unit 20 are exposed. Here, explanations for the various kinds of components are omitted.

A cable 43 inserted through an opening 411a arranged in the decorative component 411 for inserting a cable is shown.

Figure 6:
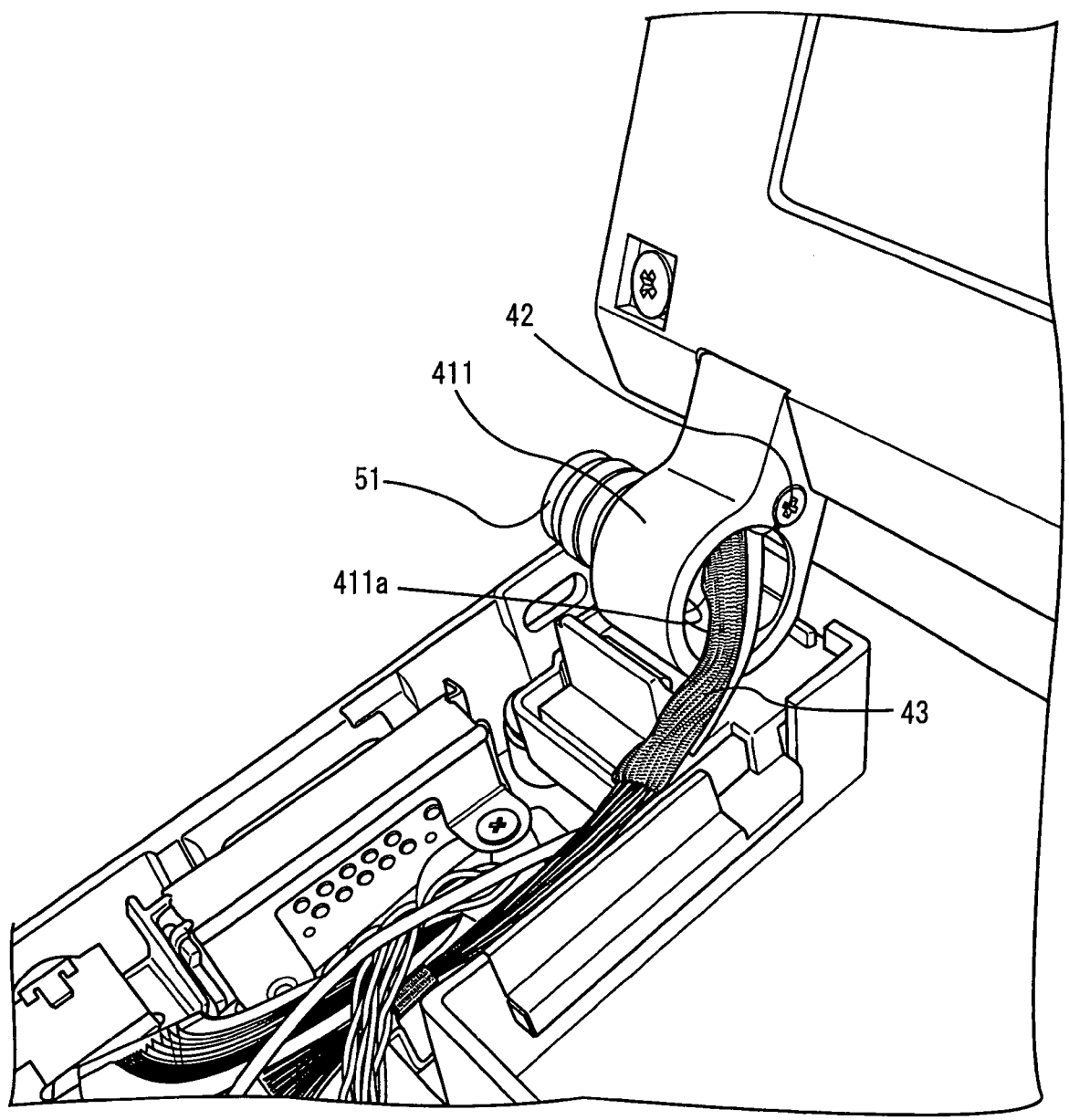
FIG. 6 is an enlarged view showing a portion around the decorative component in the state shown in FIG. 5.

FIG. 6 is an enlarged view showing a portion around the decorative component 411 in the state shown in FIG. 5.

In FIG. 6, a state in which the cable 43 is inserted through the opening 411 arranged in the decorative component 411 for inserting a cable is clearly shown. The decorative component 411 is fixed to a hinge member 51 by the screw 42. The hinge member 51 is fixed to both the main unit 20 and the display unit 30. The hinge member 51 plays a role in supporting the main unit 20 and the display unit 30 by friction in any state in which the main unit 20 and the display unit 30 open and close with respect to each other as well as joining the main unit 20 with the display unit 30.

Figure 7:
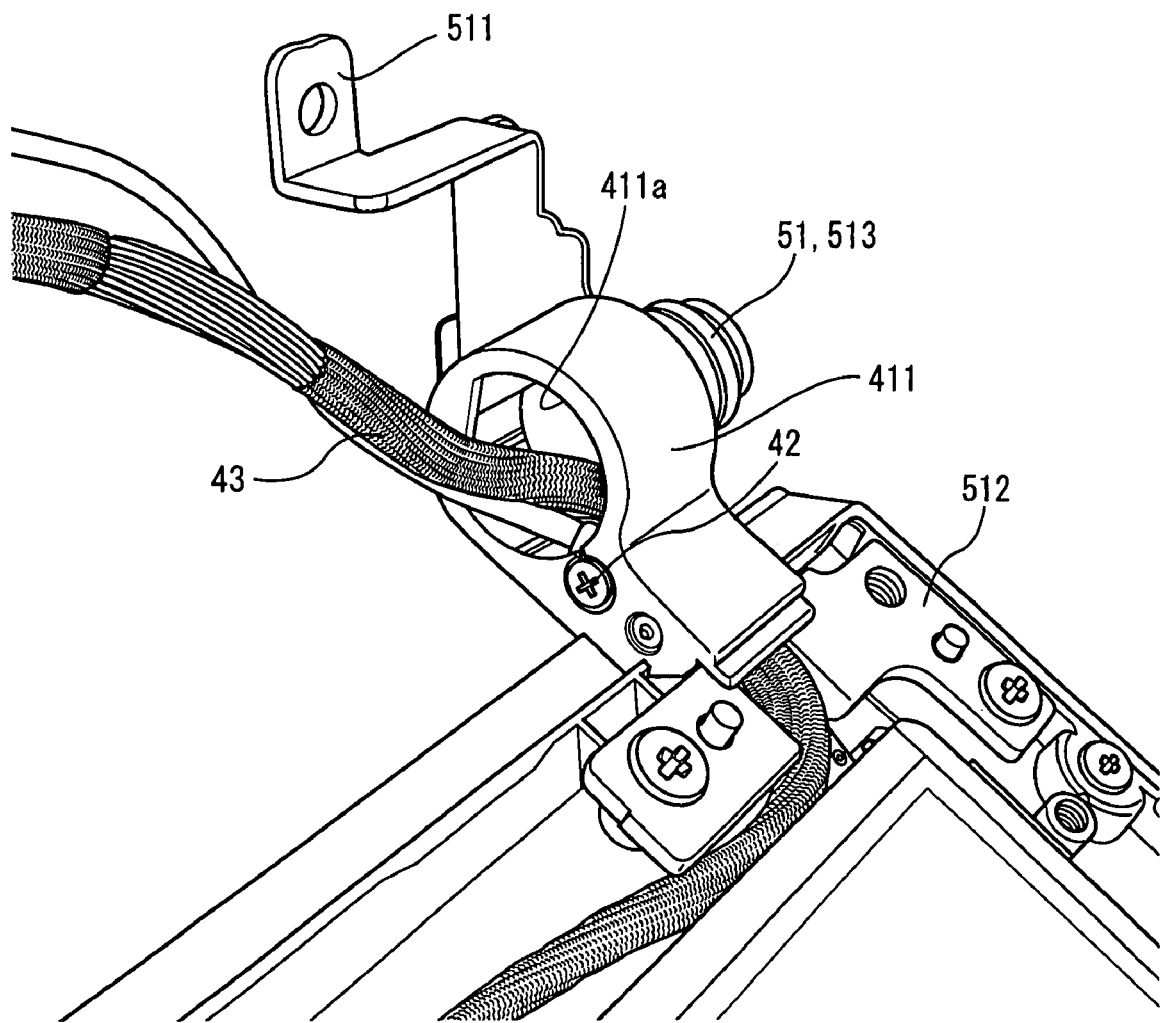
FIG. 7 is an enlarged view showing a portion around the decorative component in a state in which the main unit is removed from the PC in the state shown in FIGS. 5 and 6.

FIG. 7 is an enlarged view showing a portion around the decorative component 411 in a state in which the main unit 20 is removed from the state shown in FIGS. 5 and 6.

The hinge member 51 includes a main unit fixing section 511, a display unit fixing section 512 and a joint section 513.

The main unit fixing section 511 is fixed to the main unit. The display unit fixing section 512 is fixed to the display unit. The joint section 513 joints rotationally with a predetermined friction the main unit fixing section 511 with the display unit fixing section 512. The decorative component 411 is fixed to the hinge member 51 by the screw 42 such that the decorative component 411 covers the joint section 513.

In addition, the cable 43 goes through the cable inserting opening 411a, extends between the main unit 20 and the display unit 30 to electrically connect the main unit 20 and the display unit 30.

Figure 8:
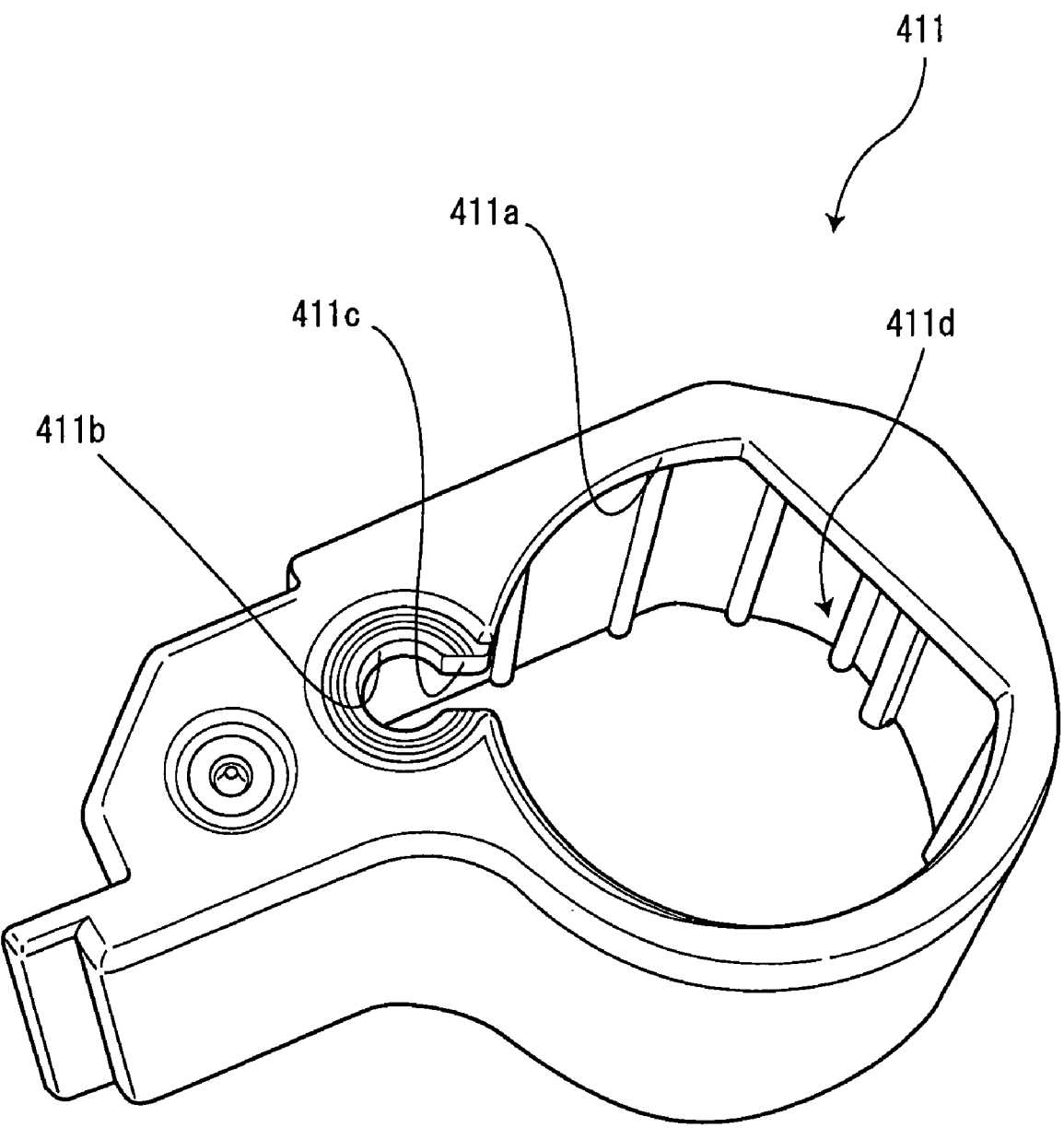
FIG. 8 is a perspective view showing the decorative component itself from the front side.
Figure 9:
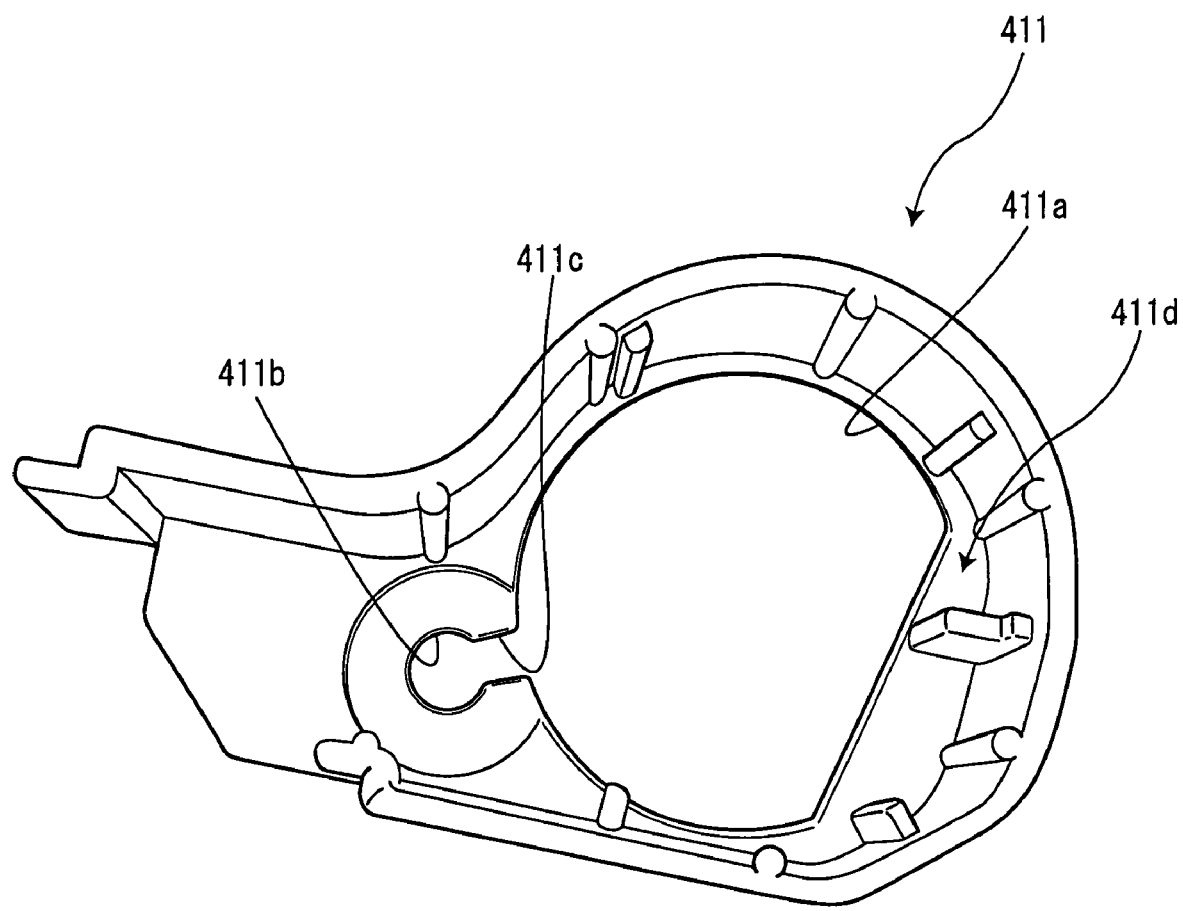
FIG. 9 is a perspective view showing the decorative component from the backside.

FIGS. 8 and 9 are perspective views showing the decorative component itself from the front side and from the backside respectively.

The cable inserting opening 411a and a screw fixing opening 411b are formed in the decorative component 411. The two openings 411a and 411b are mutually connected through a slit 411c. Further, a wide inner space 411d for housing a portion of the hinge member 51 is formed in the decorative component 411.

Figure 10:
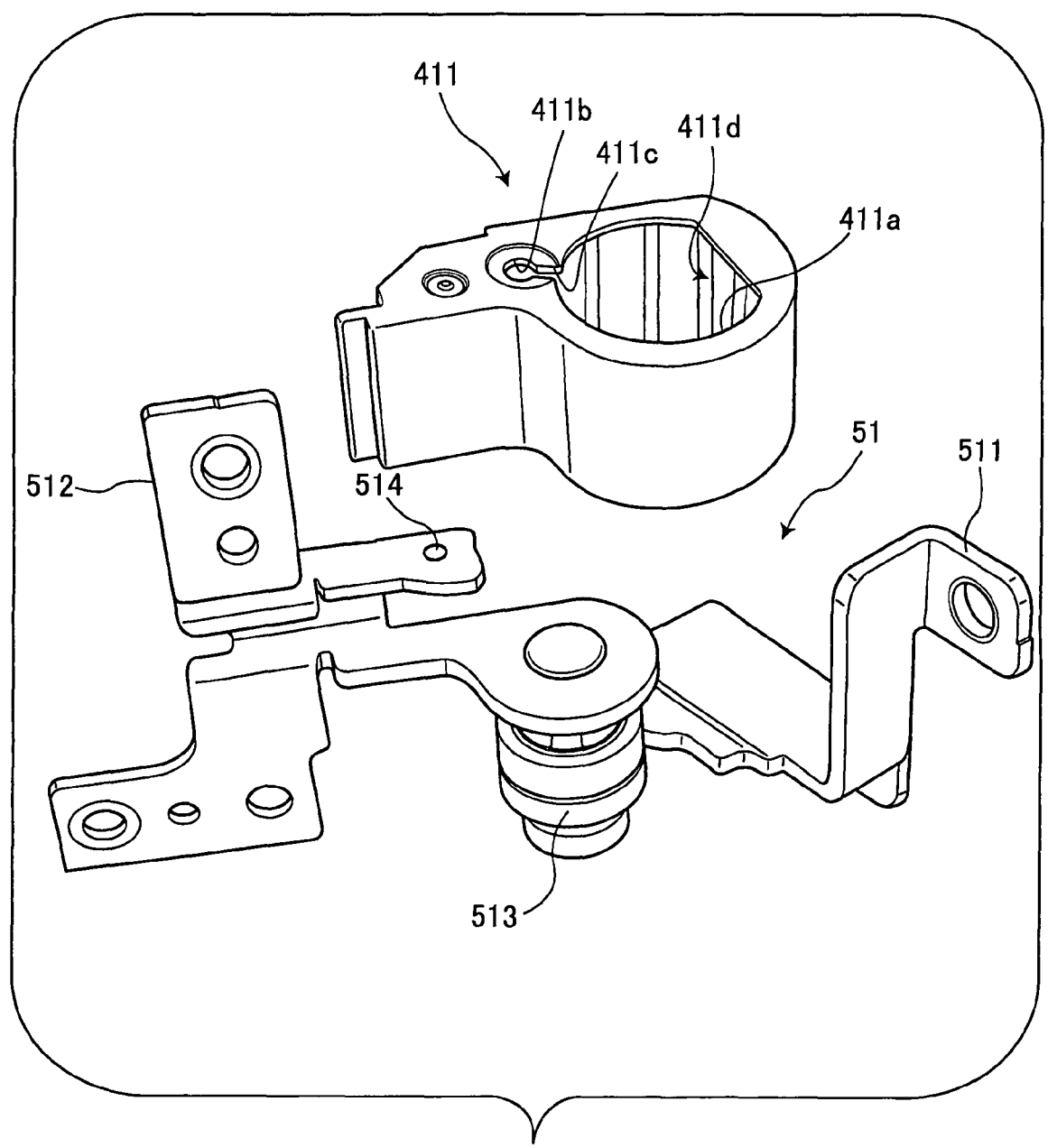
FIG. 10 is a perspective exploded view showing a position relation between a hinge member and the decorative component.

FIG. 10 is a perspective exploded view showing a positional relation between the hinge member and the decorative component.

The decorative component 411 houses a portion of a connecting section 513 of the hinge member 51 in the inner space 411d, and is disposed at a position in which the screw fixing opening 411b is disposed the screw opening 514 arranged in the hinge member 51.

Figure 11:
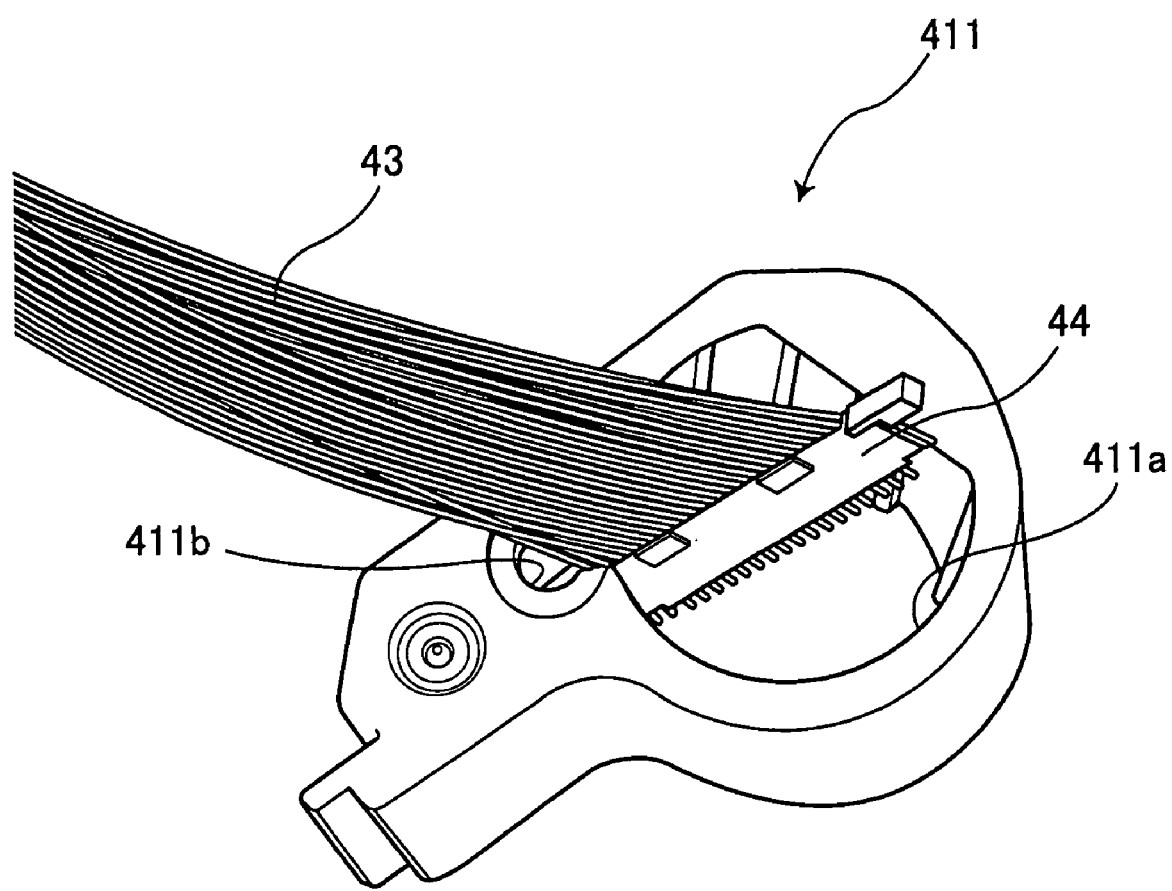
FIG. 11 is a diagram showing a state in which a cable is inserted through the decorative component.
Figure 12:
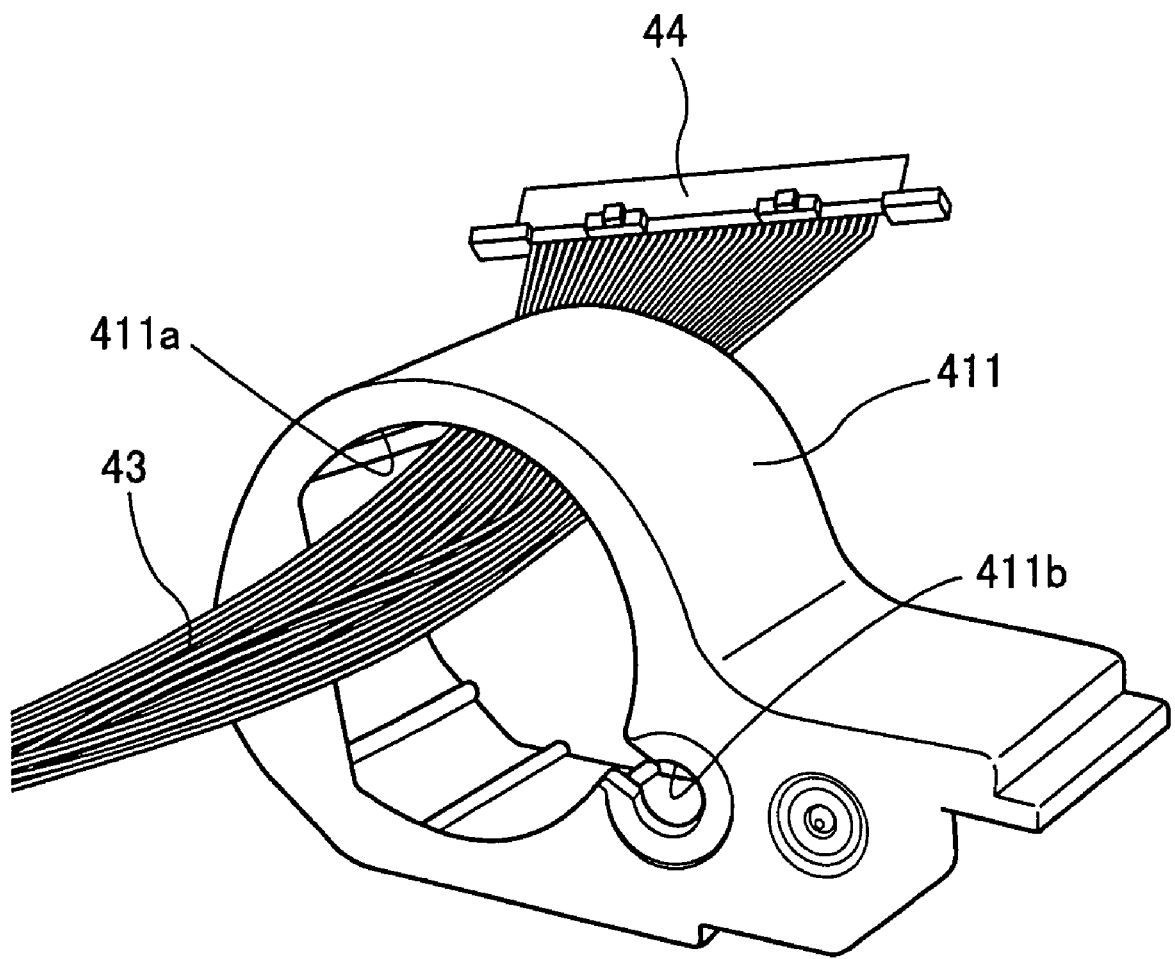
FIG. 12 is another diagram showing a state in which the cable is inserted through the decorative component.

FIGS. 11 and 12 are diagrams showing a state in which a cable is inserted through the decorative component.

A connector 44 is provided at a tip of the cables 43 (hereinafter sometimes collectively referred to as "cable 43"). The connector 44 is connected to the cables 43 in an aligned state. The connector 44 is wider than a diameter of the cable inserting opening 411a and diameter of the cables 43 bound together is narrower than the diameter of the cable inserting opening 411a. Accordingly, when the connector 44 at the tip of the cable 43 is inserted through the cable inserting opening 411a of the decorative component 411, as shown in FIG. 11, the connector 44 is inserted through the cable inserting opening 411a such that a portion of the cable 43 also comes in the screw fixing opening 411b. Thus, the tip of the cable 43 can be readily inserted through the cable inserting opening 411a of the decorative component 411, thereby operability is improved.

After the tip of the cables 43 is inserted into the cable inserting opening 411a of the decorative component 411, as shown in FIG. 12, there remains a sufficient space of the cable inserting opening 411a, thereby allowing the cable 43 to be smoothly inserted through the cable inserting opening 411a.

Figure 13:
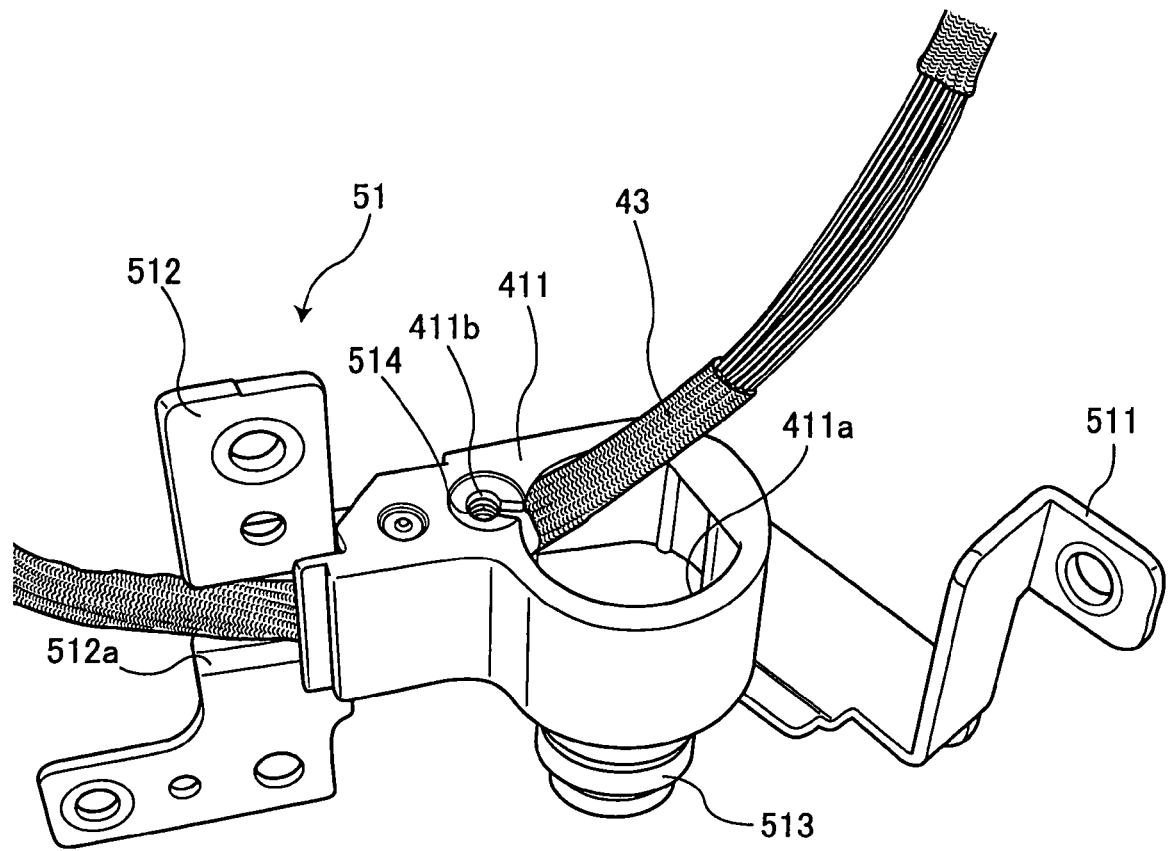
FIG. 13 is a perspective view showing the decorative component in a state in which the cable is inserted through the decorative component arranged on the hinge member.

FIG. 13 is a perspective view showing the decorative component in a state in which the cable is inserted through the decorative component, and the decorative component is arranged on the hinge member.

The cable 43 goes through the cable inserting opening 411a arranged in the decorative component 411, and extends through an indent section 512a of the display unit fixing section 512 in the hinge member 51. One end of the cable 43 is connected to the inside of the main unit and the other end of the cable 43 is connected to the inside of the display unit.

Figure 14:
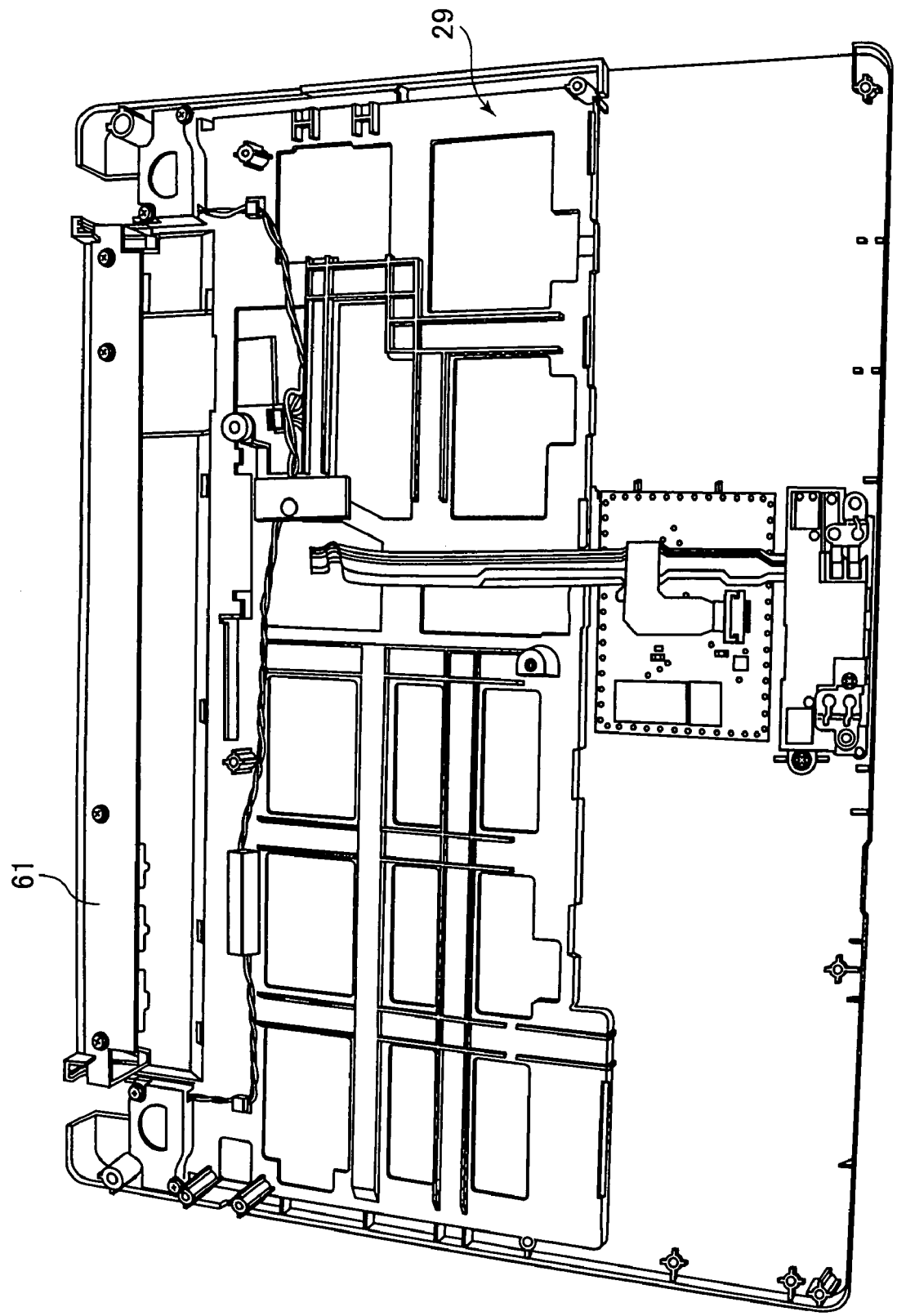
FIG. 14 is a perspective view showing an inner face of the top cover covering the main unit removed as shown in FIG. 5.

FIG. 14 is a perspective view showing an inner face of the top cover 29 covering the main unit 20, when the top cover is removed as shown in FIG. 5.

Some components are arranged on the inner face of the top cover 29. Here, of those components, a board fixing member 61 to which a flexible board described later is fixed will be described.

The board fixing member 61 is fixed inside the top cover 29, specifically at rear side of the top cover 29, where the main unit 20 (for example, see FIG. 5) is hinged to the display unit 30.

FIG. 14 illustrates a back of the board fixing member 61 with respect to a supporting face for supporting the flexible board.

Figure 15:
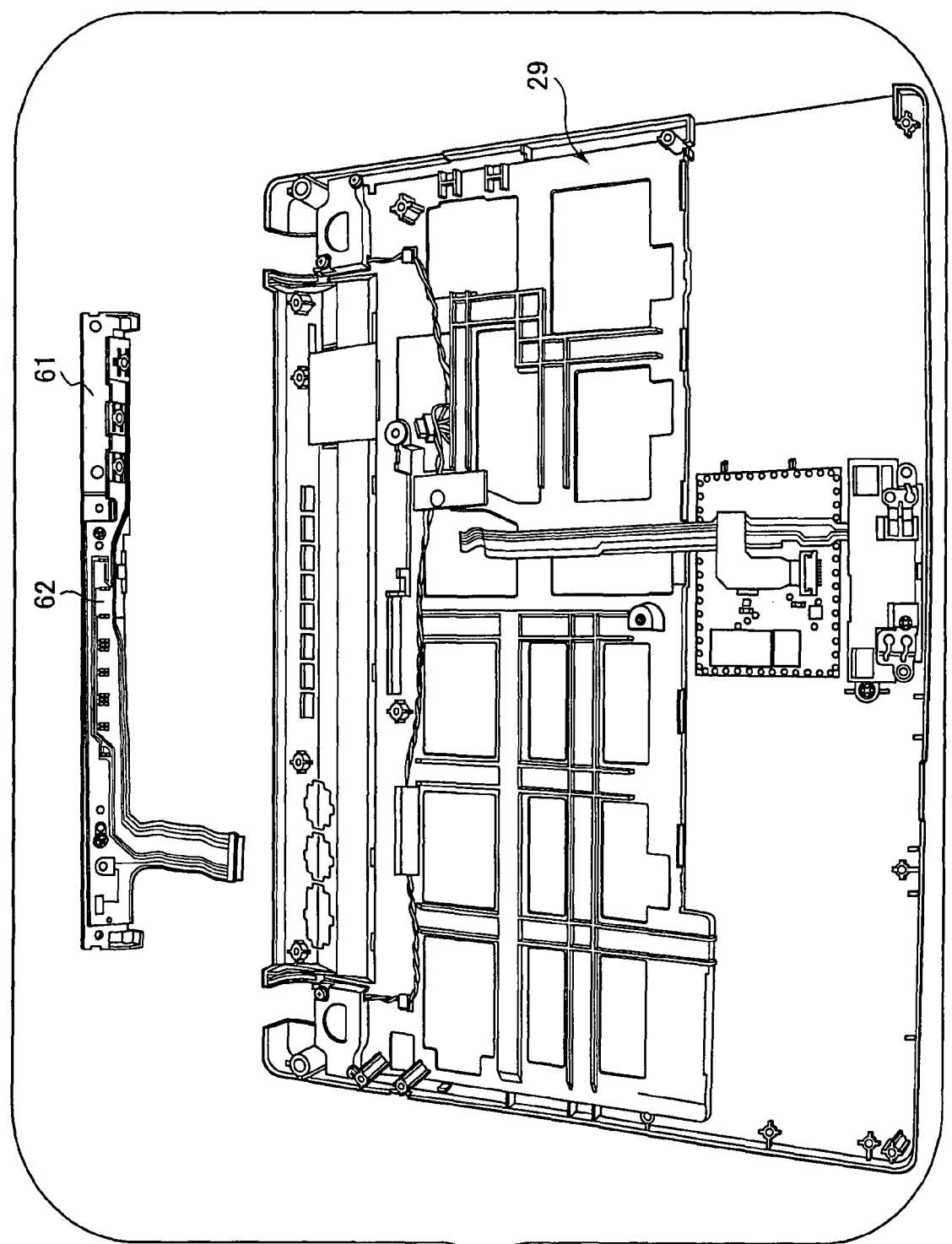
FIG. 15 is a perspective exploded view showing the inner face of the top cover and a board fixing member is removed, and the board fixing member in the state in which the board fixing member is removed from the top cover.

FIG. 15 is a perspective exploded view showing the inner face of the top cover 29 and the board fixing member 61 in the state in which it is removed from the top cover. FIG. 15 illustrates the board fixing member 61 in a state in which a face supporting the flexible board 62 faces upward.

Figure 16:
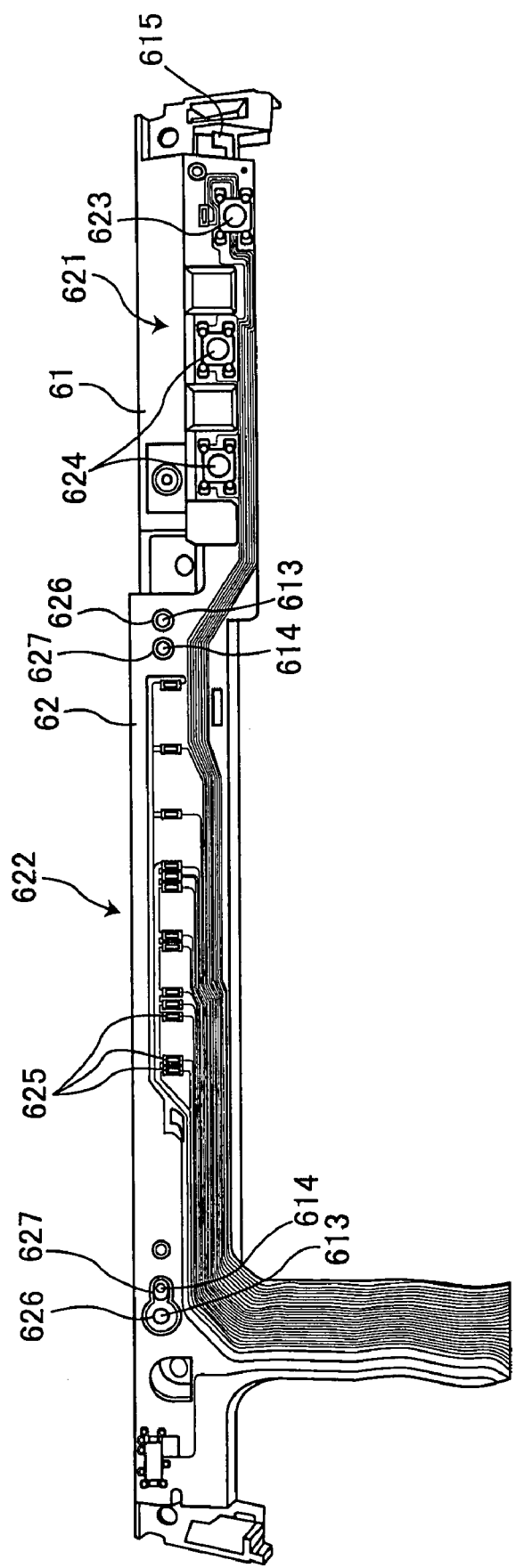
FIG. 16 is an enlarged perspective view showing the board fixing member in a state in which a flexible board is fixed to the board fixing member.
Figure 17:
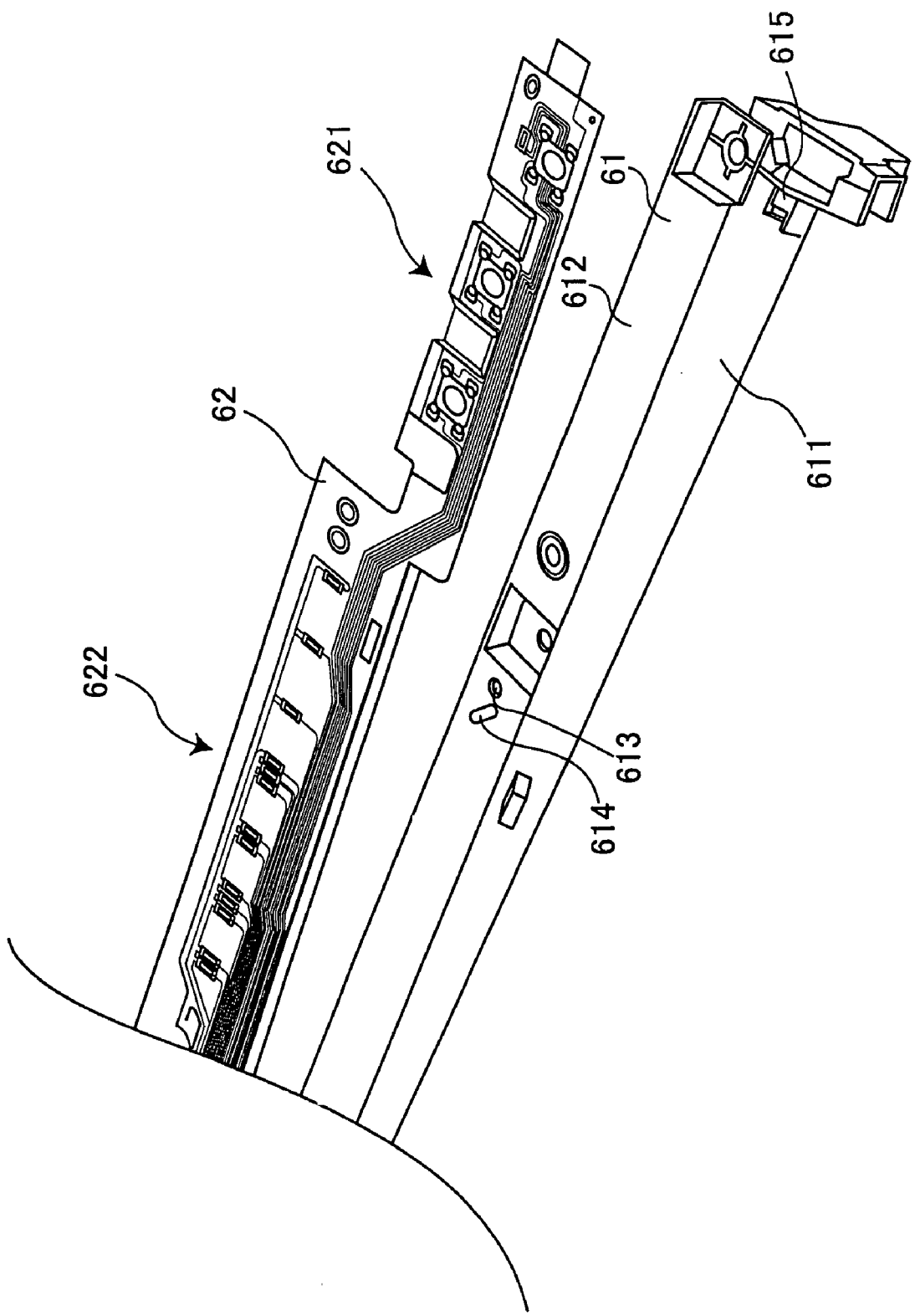
FIG. 17 is an exploded perspective view showing both the flexible board and the board fixing member.
Figure 18:
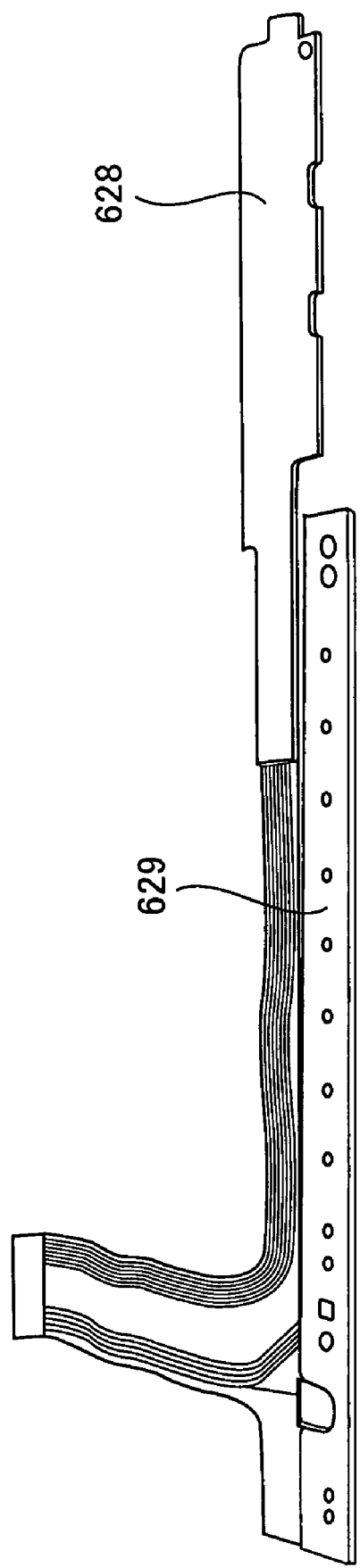
FIG. 18 is a perspective view showing a back face of the flexible board.

FIG. 16 is an enlarged perspective view showing the board fixing member 61 in a state in which the flexible board 62 is fixed to the board fixing member 61. FIG. 17 is an exploded perspective view showing both the flexible board 62 and the board fixing member 61. FIG. 18 is a perspective view showing a back face of the flexible board 62.

As shown in FIG. 17, the board fixing member 61 includes a first board supporting face 611 and a second board supporting face 612. The first board supporting face 611 faces obliquely upward and the second board supporting face faces upward. Oh the other hand, the flexible board 62 includes a first supported portion 621 and a second supported portion 622 which are supported by the first and second board supporting faces 611 and 612 of the board fixing member 61 respectively.

As shown in FIG. 16, a push button switch 623 and two function switches 624 are arranged in the first portion 621 of the flexible board 62. Plural light emitting devices 625 are arranged in the second portion 622 of the flexible board 62. In addition, a screw fixing opening 626 is arranged in the second portion 622, and a positioning opening 627 is also arranged in the second portion 622.

On the other hand, in the second board supporting face 612 of the board fixing member 61, a tapped hole 613 is formed at a position corresponding to the screw fixing opening 626 disposed in the flexible board 62, and a positioning boss 614 stands at a position corresponding to the positioning opening 627 disposed in the flexible board 62 (see FIG. 17).

In addition, an engaging section 615 which engages a tip of the first portion 621 of the flexible board 62 is disposed in the board fixing section 61.

In addition, as shown in FIG. 18, in a bottom face of the flexible board 61, a first reinforcement plate 628 is attached to the back of the first portion 621 of the flexible board 62, and a second reinforcement member 629 is attached to the back of the second portion 622 of the flexible board 62.

The first and second reinforcement plates 628 and 629 are components independent to each other. A part of the flexible board 62 corresponding to a gap between the first and second reinforcement plates 628 ad 629 has flexibility. Because this flexible part can bend, the first portion 621 is stably supported by the first board supporting face 611 of the board fixing member 61 and the second portion 622 is stably supported by the second board supporting face 612 of the board fixing member 61.

When the flexible board 62 is fixed on the board fixing member 61, the second portion 622 of the flexible board 62 is placed on the second board supporting face 612 of the board fixing member 61 such that a tip of the first portion 621 of the flexible board 62 (a tip of the first reinforcement plate 628) is engaged with the engaging section 615 disposed in the first board supporting face 611 of the board fixing member 61, and the positioning boss 614 disposed in the second board supporting face 612 of the board fixing member 61 is engaged into the positioning opening 627 disposed in the second portion 622 of the flexible board 62. Accordingly, since the screw fixing opening 626 disposed in the second portion 622 of the flexible board 62 is overlapped with the tapped hole 613 disposed in the second supporting face of the board fixing member 61, the flexible board 62 is fixed by a screw to the board fixing member 61, using the screw fixing opening 626 and the tapped hole 613. Thus, by the structure in which the first portion 621 of the flexible board 62 is only engaged and the second portion 622 is fixed by a screw, assembling is readily performed. Further, providing the positioning opening 627 and the positioning boss 614 improves workability. However, positioning the screw fixing opening 626 to the tapped hole 613 is not much difficult. Therefore, the positioning opening 627 and the positioning boss 614 are not necessarily required.

Figure 19:
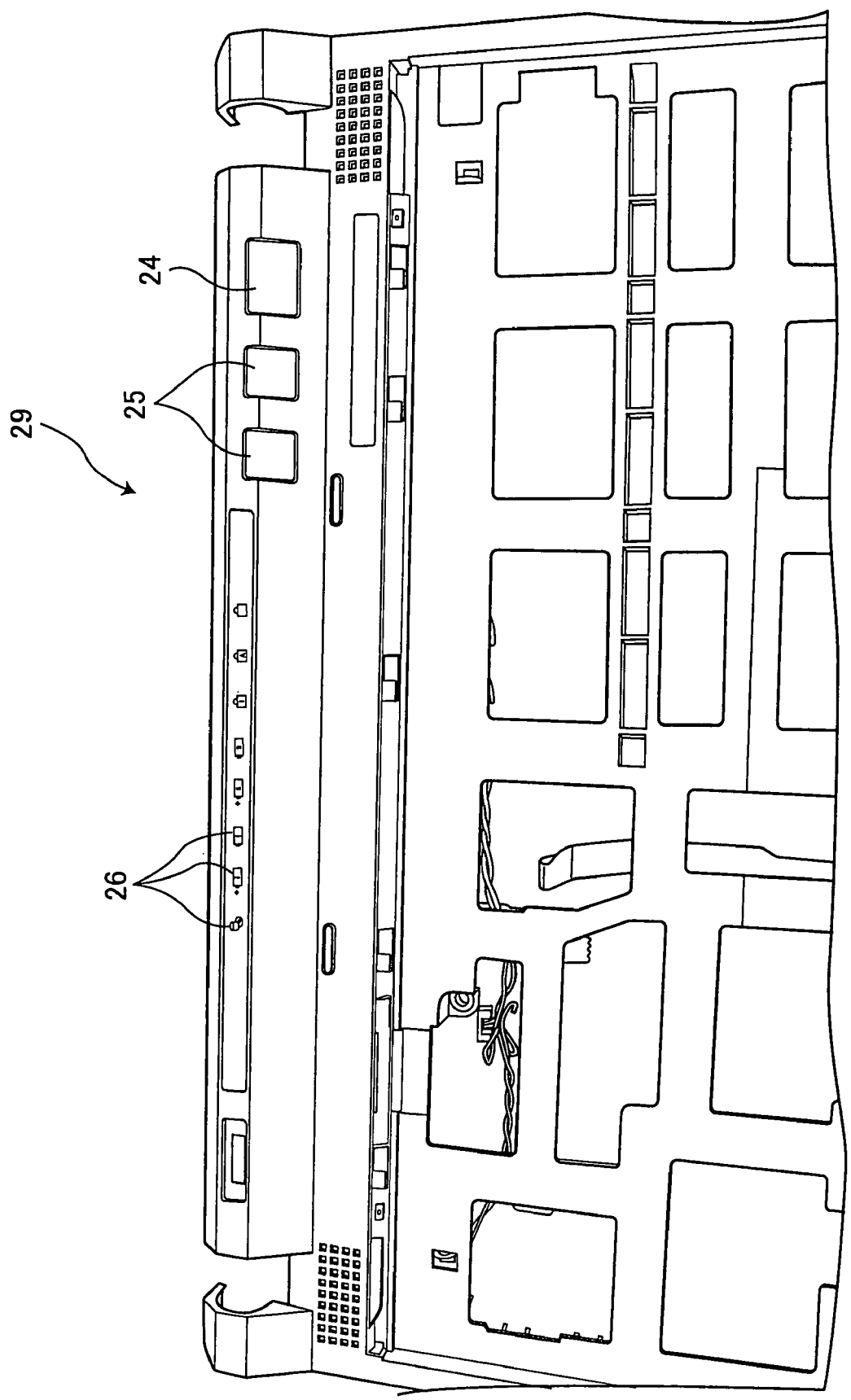
FIG. 19 is an enlarged view showing a front face of a portion covering the top of the main unit to which portion the board fixing member is fixed.

FIG. 19 is an enlarged view showing a front face of a portion of the top cover covering a top of the main unit 20 to which portion the board fixing member 61 is fixed.

In the top cover 29, the power button 24 for pushing the push button switch 623 in response to pushing down is arranged at a position corresponding to the push button switch 623 for switching the power on and off disposed on the flexible board 62 (see FIG. 16) fixed to the board fixing member 61 (see FIG. 14) fixed on the back face of the top cover 29. The two function buttons 25 for pushing down the corresponding function switches 624 in response to pushing down are arranged at positions corresponding to the two function switches 624 on the flexible board 62 respectively.

Since the power button 24 and function button 25 are pushed obliquely downward, the push button switch 623 and function switch 624 both on the flexible board 62 are mounted on the first portion 621 of the flexible board 62. The first portion 621 is supported by the first board supporting face 611 of the board fixing member 61. The first board supporting face faces obliquely downward.

In addition, the top cover 29 is formed by using white a color plastic which allows light to scatter and transmit. The various display marks 26 recalling the meaning of light emitting of the light emitting devices 625 are formed at a portion of the top cover 29, which portion is right above the light emitting devices 625 (see FIG. 16) arranged on the flexible board 62, and which portion covers the second portion 622 of the flexible board 62. The light emitting devices 625 on the flexible board 62 is arranged on the second portion 622 of the flexible board 62, which portion 622 is supported by the second board supporting face 612 of the board fixing member 61. Corresponding to this arrangement, the various kinds of display marks 26 formed on the top cover 29 are formed in a portion of the top cover 29 which portion faces upward.

What is claimed is:

1. An electronic apparatus comprising:
a board fixing member that includes a first board supporting face and a second board supporting face both of which are adjacent to each other with an angle; and
a flexible board to be fixed in a state in which the flexible board is supported by both the first and second board supporting faces of the board fixing member,
wherein the flexible board includes a first reinforcement plate at a first portion supported by the first board supporting face and a second reinforcement plate at a second portion supported by the second board supporting face, and the first reinforcement plate and the second reinforcement plate are extended between the board fixing member and the flexible board.

2. The electronic apparatus according to claim 1, wherein the board fixing member further includes:

an engaging section that engages the first portion of the flexible board; and a fixing section that fixes the second portion of the flexible board by a fastening member, wherein the flexible board includes in the second portion a fastening opening through which the fastening member is to be inserted, and the flexible board is fixed such that the first portion is engaged with the engaging section and the second portion is fastened to the fixing section by the fastening member whose second portion is inserted through the fastening opening.

3. The electronic apparatus according to claim 2, wherein the board fixing member includes a positioning boss projected on the second board supporting face, and the flexible board includes in the second portion a positioning opening into which the positioning boss is engaged.

4. The electronic apparatus according to claim 1, wherein the flexible board is a board in which at least one push button switch is mounted at one of the first portion and the second portion, and in which at least one light emitting device is mounted at the other portion of the first portion and the second portion.

5. A flexible board that is included in an electronic apparatus, and is fixed in a state in which the flexible board is supported by both a first board supporting face and a second board supporting face both of a board supporting member, the face being adjacent to each other with an angle, the flexible board comprising:

a first reinforcement plate at a first portion supported by the first board supporting face and a second reinforcement plate at a second portion supported by the second board supporting face, wherein the first reinforcement plate and the second reinforcement plate are extended between the board fixing member and the flexible board.

6. The flexible board according to claim 5, wherein the board fixing member includes:

an engaging section that engages the first portion of the flexible board; and a fixing section that fixes the second portion of the flexible board by a fastening member, wherein the flexible board includes in the second portion a fastening opening through which a fastening member is inserted, wherein the first portion is engaged with the engaging section, and the second portion is fastened to the fixing section by the fastening member whose second portion is inserted through the fastening opening.

7. The flexible board according to claim 6, wherein the board fixing member includes a positioning boss projected on the second board supporting face, and the flexible board includes in the second portion a positioning opening into which the positioning boss is engaged.

8. The flexible board according to claim 5, wherein the flexible board is a board in which at least one push button switch is mounted at one of the first portion and the second portion, and in which at least one light emitting device is mounted at the other portion of the first portion and the second portion.

9. The flexible board according to claim 2, wherein the fastening member is a screw.

10. A board fixing member that supports and fixes a flexible board, the board fixing member comprising:

a first board supporting face; and a second board supporting face formed adjacent to the first board supporting face with an angle, wherein the flexible board is fixed in a state in which the flexible board is supported by both the first and second board supporting faces of the board fixing member, and includes a first reinforcement plate at a first portion supported by the first board supporting face and a second reinforcement plate at a second portion supported by the second board supporting face, and the board fixing member further comprises:

an engaging section that is formed in the first board supporting face and engages the first portion of the flexible board; and a fixing section that fixes the second portion by receiving a fastening member which is inserted through a fastening opening formed at the second portion of the flexible board.

11. The board fixing member according to claim 10, wherein the flexible board further includes a positioning opening at the second portion, and the board fixing member further comprises a positioning boss formed to be projected on the second board supporting face, and to be engaged in the positioning opening of the flexible board.

* * * * *